May 31, 1960

R. J. MALCOLM 2,938,939

PRINTED CIRCUIT PANEL

Original Filed May 31, 1956

2 Sheets-Sheet 1

INVENTOR
ROBERT J. MALCOLM
BY
Mason, Kolehmainen, Rathburn and Wyss
ATTORNEYS

May 31, 1960

R. J. MALCOLM

PRINTED CIRCUIT PANEL 2,938,939

Original Filed May 31, 1956

2 Sheets-Sheet 2

INVENTOR

ROBERT J. MALCOLM

BY

Mason, Kolehmainen, Rathburn and Wyss

ATTORNEYS 2,938,939

PRINTED CIRCUIT PANEL

Robert J. Malcolm, 311 E. Rockwell St., Arlington Heights, Ill.

Original application May 31, 1956, Ser. No. 588,323, now Patent No. 2,772,501, dated Dec. 4, 1956. Divided and this application Sept. 19, 1956, Ser. No. 610,850

1 Claim. (Cl. 174—68.5)

The present invention relates generally to an electrical device, and, more particularly, to a simple and economic arrangement involving an insulating base and electric circuit defining a so-called "printed circuit." The present invention is a division of a copending application of Robert J. Malcolm, Serial No. 588,323, filed May 31, 1956, now Patent No. 2,772,501, issued December 4, 1956.

With the advent and increased use of printed circuits for various types of electrical and electronic equipment, it has become desirable to find a process for producing these circuits which is easily performed and, at the same time, results in the production of the circuit at a minimum cost. The methods of the prior art have generally failed to meet such requirements in that such methods have resulted in high production costs for the circuits or in the utilization of one or more steps in the process which are either time-consuming or adversely affect the printed circuit produced. For instance, there are two basic type processes which have met with favor in the industry. The first of these includes the utilization of an insulation backed metallic foil in which portions of the foil are removed, as by etching, and the printed circuit comprises that portion of the foil which remains on the insulation backing after the removal of the undesired areas. The cost of producing this type of circuit is inherently high due to the difficulty of removing the undesired foil areas. Moreover, if an etching bath is employed in the removal step, a number of problems are introduced with respect to the handling of the acid material and with respect to corrosion and deterioration of the apparatus employed in the process. Furthermore, it is well recognized that the use of an etching step results in the deposition of a conductive residue of the etching acid on the nonconductive base material with the probability that arcing between the conducting portions of the printed circuit will occur. It would, of course, be desirable to eliminate the possibility of arcing not only to permit the use of higher voltages on the printed circuit, but also to allow the conductive portions of the circuit to be placed closer together in order to reduce the over-all dimensions of the complete circuit.

The second basic type process for forming printed circuits includes the step of applying the conductive material directly to the insulating base by means of spraying, electroplating or similar processes of this nature. While this latter type is generally less costly than the former, the printed circuit is formed by using masks or stencils to form an outline of the desired pattern. These stencils become clogged with the applied conducting material, necessitating frequent replacement, and, consequently, the process involves the intervention of an operator who must remove the stencil and insert one which is free of conductive material. It is apparent that such a process is time-consuming and is not adaptable to high speed production methods.

As is well known, the principal advantage of printed circuits flows from their light weight, their extremely small, compact construction, and their susceptibility to duplication, but, in general, these circuits have been somewhat limited due to their inability to handle currents of appreciable size. Such a limitation has resulted not only from the aforementioned difficulties with respect to arcing between the conductive portions of the circuit, but also as a result of the inability of the processes heretofore employed to provide a printed circuit including electrical conductors of sufficient size to carry relatively large currents. It would, therefore, be desirable to provide a method for producing printed circuits wherein the circuit conductors possess increased current carrying capacity without at the same time increasing the surface area required for the circuit.

In the assembly of printed circuits it frequently becomes necessary to solder or otherwise connect the printed circuit conductors to external circuit elements, such as transformers, inductors, resistors, capacitors and tube sockets. To provide for such a soldering operation with a minimum of effort and at maximum speed, it would be desirable simultaneously to effect all of the solder connections by a dipping process in which the printed circuit is immersed in a solder bath. This solder dipping is also necessary to coat the exposed surfaces of the conductive pattern of the printed circuit with a layer of solder to prevent excessive oxidation of the pattern. However, some difficulty has been encountered heretofore in making the required coatings and connections due to the fact that the printed terminals and other printed connectors tend to peel from the insulating base as a result of the heat applied during immersion in the solder bath. It would be desirable, therefore, to provide a process for forming printed circuits which completely obviates these disadvantages. Moreover, it would be desirable, for the reasons enumerated above, to provide such a process wherein the printed circuit produced possesses a relatively large capacity for holding the solder, thereby to produce solder connections having increased current carrying capacity.

In the processes of the prior art, it has frequently been found desirable to form the printed circuit upon an insulating base of phenol-formaldehyde resin or other similar thermosetting plastic material due to the fact that this material possesses such desirable characteristics as relatively high strength, excellent insulating qualities, relatively good resistance to temperature, moisture, etc. However, due to the brittleness of such materials, it is relatively difficult to provide holes therethrough for accommodating connectors adapted to be soldered to the printed terminals of the circuit in the manner described above. Thus, prior attempts to employ such base materials have required heating of the base in order to render it sufficiently pliable to permit holes to be punched therein. However, since the direction of expansion or contraction of such a base material upon application of heat thereto is generally unpredictable, the holes have often been formed in improper positions with the result that holes in the conductive portions of the printed circuit do not match the holes in the base and the circuit must be rejected. Such a result, of course, increases the production cost due both to the waste of the rejected material and to the loss of time consumed in forming the rejected circuit. On the other hand, if the holes are formed in the base material during its manufacture, the corresponding holes formed in the metal covering for the base are frequently misaligned with the result that the printed circuit formed must again be rejected. It would, of course, be desirable to provide a process for forming printed circuits which greatly reduces the possibility of rejection due to such misprinting.

The tendency in recent years in most manufacturing processes has been toward what has come to be known by the single word, automation, and printed circuits have become a very important factor in connection with automation in the electrical industry. When making electrical connections between a printed circuit associated with a suitable insulating base and independent components to be mounted thereon, it is often necessary, in automatic assembly processes, to insert certain conductors through openings provided in the insulated base. In the prior art arrangement, even ignoring the possibility of misalignment of the holes which are punched in the insulating base, there is the problem of designing and providing sufficiently precise equipment to feed conductors into the relatively small openings provided in the insulating base of the printed circuit. It would be desirable to provide an arrangement in which these openings, at least on the side of the insulating support into which the conductors are inserted, have a cone-shaped entrance or guideway so as to permit a greater error in the positioning of electrical components and still assure that they will properly enter the holes provided in the base for the printed circuit.

Moreover, in the prior art, printed circuits which have been available thus far, paper lamina insulating material or insulating material having an hydroscopic filler have commonly been employed. During the punching of such insulating materials and also during the etching and solder dipping processes, the surface of the insulating panel is disturbed so that openings are provided for water absorption, and the hydroscopic paper lamina or filler material absorbs water from the atmosphere to provide low resistance paths in the insulating base and the attendant possibility of arcing across the small space provided between adjacent conductors. It would be desirable to provide an insulating support in the process of making a printed circuit in which the surface of the material is never destroyed and no problem of water absorption arises.

In the prior art arrangements, the printed circuit and its supporting base lie within a single plane, but there are many applications in which it would be desirable to have a printed circuit disposed on several planes. It would be desirable, therefore, to provide a simple arrangement and a process whereby the printed circuit may have portions thereof on substantially different levels from other portions thereof and yet wherein the printed circuit can be formed in the same manner as if the entire circuit were in a single plane.

Accordingly, one of the primary objects of the present invention is to provide a new and improved printed circuit which obviates the above described disadvantages of the prior art arrangements.

Still another object of the present invention is to provide a printed circuit which is readily adaptable to high speed mass production manufacturing.

It is still another object of the present invention to provide an improved printed circuit which lends itself admirably to automation with respect to assembling components thereon and which permits substantial tolerances while still providing a satisfactory arrangement.

Further objects and advantages of the present invention will become apparent as the following description proceeds, and the features of novelty will be pointed out with particularity in the claim annexed to and forming a part of this specification.

In accordance with the present invention, the foregoing and other objects are realized by employing a process for forming printed circuits or similar electrical components which includes the steps of providing, as by molding, an insulating base including a plurality of preformed grooves and holes respectively corresponding to the location of the connectors and terminals of the printed circuit to be formed, covering the insulating base with a lamination of metal foil having a reactivatable adhesive coating on the side of the foil facing the base material, forcing the adhesively coated foil against the base material through a sheet of flexible material in order to direct segments of the conductive foil into the grooved portions of the base while at the same time shearing these segments from the foil, removing the unused portions of the foil, and finally reactivating the adhesive coating on the foil in order to form a strong bond between the grooved portions of the base and the metal foil disposed therein. Preferably and in accordance with the present invention, the preformed grooves are molded in such a fashion that during the shearing operation of the metal, it is stretched so as to be wider than the groove so that, upon completion of the shearing operation, the inherent spring force in the material tends to force it against the walls of the groove to maintain the sheared foil segments within the grooves. This feature of the invention is applicable whether the invention is used for an electrical circuit or for other purposes and irrespective of whether the invention employs the reactivatable adhesive. The invention further includes making the openings molded in the insulating base of a funnel shape on at least one side to facilitate the insertion of electrical components therein by automatic means. In accordance with another aspect of the present invention, the preformed grooves may have different levels with the result that the conducting or metallic material is disposed in the grooves and disposed at different levels as well.

For a better understanding of the present invention, reference may be had to the accompanying drawings wherein:

Fig. 1 is a fragmentary plan view of a portion of the insulating base employed in the practice of the method of the present invention showing the base with a plurality of grooves formed therein for the reception of the conductive portions of the printed circuit and also including a plurality of holes therein for accommodating the printed circuit terminals, external circuit connectors, pins of the vacuum tubes employed in the circuit and other similar devices;

Fig. 2 represents one stage of the manufacture of the process employed in the manufacture of a printed circuit and comprises a greatly enlarged fragmentary sectional view taken along the line substantially corresponding to the line 2—2 in Fig. 1 showing the adhesively coated foil disposed above the insulating base in proper position for being forced against the insulating base by a sheet of flexible material;

Figure 1:
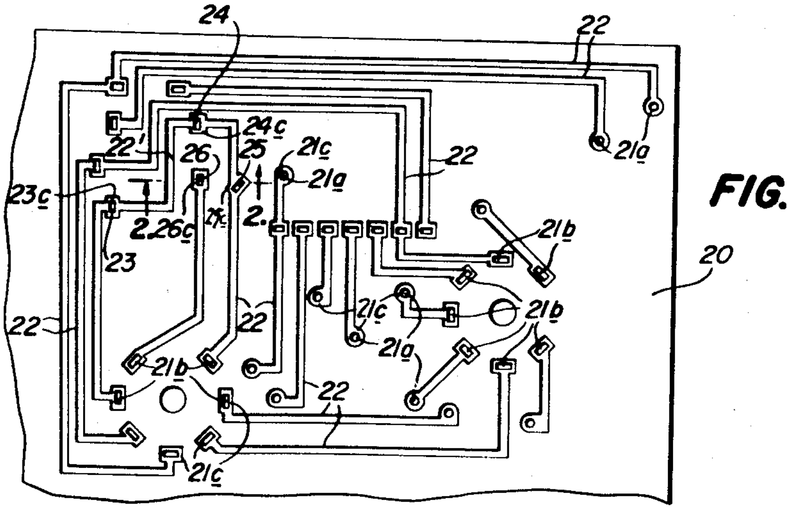

Referring now to Figs. 1 to 4 of the drawings, and, more particularly to Fig. 1 thereof, an insulating base 20, formed of suitable insulating material such as phenol-formaldehyde or urea-formaldehyde resin, is there illustrated in the form of a relatively flat base having any desired external dimensions and configuration. The base 20, which may actually serve as the chassis for the electrical equipment to be produced, may be formed of any suitable electrically insulated plastic or resinous material which is capable of being formed into appropriate configuration by pressure and heat and can be molded or otherwise formed into an insulating base of the type shown in Fig. 1. Obviously, the selection of the base material will be controlled to some extent by the particular environment in which the completed circuit is to be used. Thus, for example, it may be desirable to employ a base material capable of resisting the effects of moisture and relatively high temperatures for installations where these particular conditions may be encountered and resins attributing such characteristic to the base may be chosen. In any event, the base is generally formed of a material capable of withstanding the temperatures of molten solder in order to permit its immersion in a soldering bath for a period of time sufficient to form the soldered connections described hereinafter.

The base 20 may be of any desired thickness, and, for example, may vary from a few thousandths of an inch to a much greater value. During the molding operation the base 20 is formed with a plurality of spaced holes or openings of suitable shape extending therethrough from one side to the other, which, as previously indicated, may be adapted to accommodate external circuit connectors, terminal members such as eyelets or other mechanical attachments, and other devices of this character. Typical holes for performing these functions are designated as **21*a* in Fig. 1, and, for purposes of illustration, are shown as being either of circular or rectangular configuration, although obviously, these holes may assume any shape consonant with the device intended to be accommodated therein. Other holes may be provided in the typical base illustrated in Fig. 1 for receiving terminals for the tube pins of a conventional vacuum tube as illustrated by the rectangularly-shaped holes 21*b*. As indicated above, certain of the other holes may be adapted to receive lead wires of external circuit components such as resistors, capacitors, inductors, transformers and the like conventionally employed in electrical circuits utilizing the printed circuits produced by the process of the present invention. Each of the holes 21*a* and 21*b* is surrounded by an indentation formed in at least one of the surface portions of the base 20, these indentations being designated by the reference character 21*c***, and each preferably having a shape conforming to that of the particular hole which it surrounds.

In addition to the spaced holes just described, the insulating base 20 is also molded or otherwise formed with a plurality of spaced grooves 22 therein interconnecting the various terminals and the electrical components connected to the printed circuit in predetermined sequence, the particular sequence, of course, being a function of the circuit arrangement being produced. These grooves may be adapted to receive the connectors or conductors of a conventional printed electrical circuit, or, in the alternative, might conceivably have embedded therein a suitable resistance material or even a semiconductor. For the purpose of the present explanation, however, it will be assumed that all of the grooves 22 are adapted to accommodate the electrical conductors for the printed circuit. Moreover, although the base 20 illustrated in Fig. 1 is shown as including the grooves 22 and the indentations **21*c* surrounding the openings in the base upon only one of its faces, it should be understood that in many installations it will be advantageous to form the base member with similar grooves and indentations on the reverse face in order to provide a second printed electrical circuit by the process to be described hereinafter. However, the ensuing description will be limited to the formation of the desired printed circuit on only one side of the base 20**, it being understood that similar procedure could be followed in order to produce a second circuit on the reverse side.

Thus, in the circuit shown in Fig. 1, it is desired to provide an electrical connection between openings 23 and 24 in the base member by embedding a conductor within the groove 22'. The groove 22' and the openings 23 and 24 have been selected as exemplary and have been given reference numerals differing from the other openings **21*a* and the grooves 22 in the base only because they are discussed in detail hereinafter, it being understood that they are identical with their counterparts except for any variations in shape and size necessary to enable them to perform their intended functions. In a similar manner, it is desired to connect the hole 24 through a conductor embedded in the groove 22' to the opening 25 and so on until the entire printed circuit is formed. At the same time it is desired to embed conductive circuit portions within the indentations 23*c*, 24*c*, 25*c* and 26*c*, respectively, surrounding the openings 23, 24, 25 and 26, in order to form terminal or connector receiving regions of appreciable size in the vicinity of the openings. Since the remaining terminals and conductors of the printed circuit are similar to those just described, a consideration of the method for forming the conductive portions of the circuit within the groove 22' and within the indentations 25*c* and 26*c*, respectively, surrounding the openings 25 and 26** will adequately illustrate the principles involved in the practice of the method of the present invention.

Figure 2:
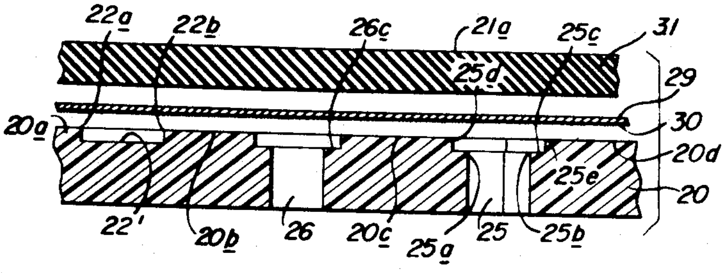
Figure 12:
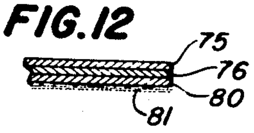
Fig. 12 is an enlarged fragmentary cross sectional view similar to Fig. 11 illustrating a section of sheet metal coated on both sides with solder.
Figure 3:
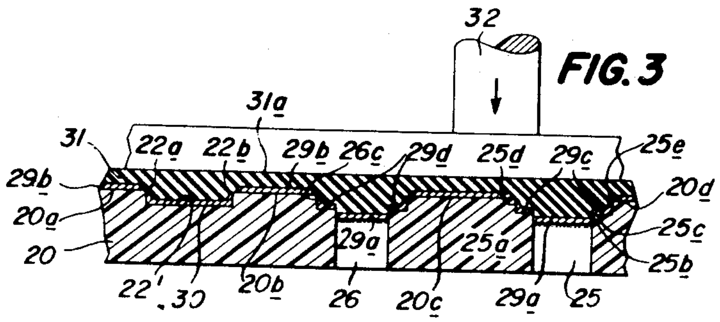
Fig. 3 represents another stage in the process of manufacturing printed circuits in accordance with the present invention following the stage shown in Fig. 2 and shows the position of the adhesively coated foil and the flexible sheet after they have been forced against the insulating base.

Turning now to a description of the manner in which the conductive portions of the printed circuit are formed, a metallic sheet or foil designated as 29 in Fig. 2, and preferably having external dimensions substantially corresponding to the dimensions of the base 20 is disposed adjacent the base. The metallic sheet or foil 29 may be formed of any suitable material such as copper and is coated on its underside with a reactivatable adhesive 30 which, prior to reactivation, is a dry material possessing negligible adhesive qualities. The coated foil 29 is next covered by a sheet of flexible, resilient or yieldable plastic material such as rubber or the like designated as 31 in Fig. 2. As shown in Fig. 3, pressure is then applied to the upper surface **31*a* of the resilient sheet 31 by employing a punch press operated either hydraulically or pneumatically or by using a compressing roller or other similar device, the force applying means being designated as 32**.

The application of force to the upper surface **31*a* of the resilient sheet 31, as indicated in Fig. 3, compresses the resilient sheet and forces the coated metal foil 29 against the insulating base member 20** with the result that the grooves and the holes in this member effectively shear the top edges of the foil to delineate the foil configuration desired in the printed circuit ultimately to be produced. Specifically, edges 22a and 22b of the groove 22' shear the coated foil pressed against these edges with the result that a current carrying conductor is embedded within the groove 22' while unused portions 29b of the foil are situated on raised portions 20a and 20b of the base adjacent the groove 22'. The described shearing action causes deposition within the groove 22' of a portion of the foil 29 of sufficient size to cover both the bottom of this groove and its two side edges, as clearly illustrated in Fig. 3. In similar manner, the application of pressure to the upper surface of the resilient sheet 31 causes the edges 25a and 25b of the walls defining the rectangular opening 25 to shear off a portion 29a of the insulating foil 29 having a shape corresponding to that of the opening 25. As a result the sheared portion 29a is forced through the opening 25 and away from the base 20. Edges 25d and 25e defining the indentation 25c around the opening 25 function to shear the portion of the metallic foil pressed against these edges with the result that unused portions 29b of the foil rest upon raised surfaces 20c and 20d of the base adjacent the indentation 25c. A portion 29c of the foil between shearing edges 25a, 25b, 25d and 25e is forced into the indentation 25c and covers both the bottom of this indentation and the side portions of the base adjacent thereto, as illustrated in Fig. 3. Similar shearing occurs along the edges of the walls defining the opening 26 and its surrounding indentation 26c in order to deposit a conducting foil portion 29d along the bottom and sides of the latter indentation. At this time, the adhesive coating 30 on the faces of the metallic foil 29 in engagement with the base 20 is still ineffective and provides no bonding action with the result that the unused portions 29b of the foil may be removed from the base in any suitable manner as by a brushing operation or by directing air across the surface of the base 20. In the event that the portions 29a within the openings 25 and 26 do not fall from the base under the effect of gravity, these, too, may be removed in the manner just described.

Figure 4:
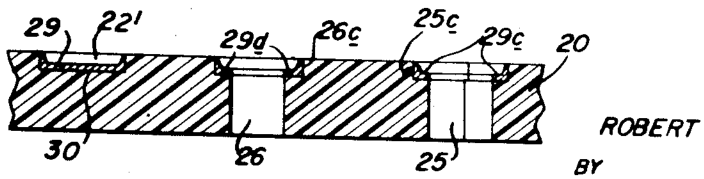
Fig. 4 illustrates still another stage of manufacturing printed circuits in accordance with the present invention subsequent to the stage shown in Fig. 3 and illustrates a portion of the printed circuit formed after withdrawal of the flexible sheet shown in Figs. 2 and 3.

After the unused portions of the foil have been removed and after the resilient sheet 21 has been withdrawn out of engagement with the base by withdrawal of the mechanism 32, the adhesive coating 30 is reactivated. To this end, the coating 30 may be of a solvent reactivatable type, in which case the insulating base 20 with its conductors and terminal members embedded in the various grooves and indentations therein, in the manner shown in Fig. 4, is immersed in a suitable solvent. One particular coating which has been found to afford satisfactory results in the practice of the method of the present invention comprises a rubber-phenolic base adhesive capable of reactivation by immersion in a suitable solvent, such as ethyl acetate. A suitable solvent reactivatable adhesive of this type is furnished under the trade name Fuze On by Aetna Supply, Inc., of Arlington Heights, Illinois. When exposed to the solvent, such a coating is reactivated in order to establish a firm adhesive bond between the conducting portions of the printed circuit and the grooves and indentations in the base to which those portions are exposed.

In the alternative, a heat reactivated adhesive coating 30 may be employed which responds to the application of heat by producing a firm bond between the metallic foil and the base 20. Suitable heat reactivated adhesives are commercially available and may comprise a mixture of an epoxy resin, such as that obtained by reacting epichlorohydrin and a bis-phenol, and a linear polyamide, such as that resulting from the condensation of dimerized linoleic acid and ethylenediamine; a mixture of an epoxy resin with maleic or phthalic acids; or a mixture of an epoxy resin with an amine such as diethylenetriamine, m-phenylenediamine or melamine.

From the foregoing explanation, it will be apparent that, if a solvent reactivated adhesive layer 30 is employed, the base member 20 and the metallic foil contained within the various grooves and indentations therein, as shown in Fig. 4, are immersed within a solvent which functions to reactivate the adhesive and produce a strong bond between all of the contiguous areas of the foil and the base member. It will be understood that the solvent will reach the desired areas by capillary attraction. Similarly, if a heat reactivated adhesive layer is employed, the structure shown in Fig. 4 is subjected to heat in order to produce the desired bonding of the adhesive layer. In either case, a strong adhesive bond is produced between the underside of the metallic foil and all of the base areas to which it is exposed.

The metallic foil 29 may be of any appropriate thickness for carrying the currents flowing in the particular circuit being produced. Obviously, the depth of the various grooves and indentations in the base member 20 may vary in accordance with the thickness of the metallic foil employed with the result that circuits possessing relatively large current carrying capacity may be produced.

The circuit formed by the method described above may be completed by the application of the desired connections to external circuit components of the type described above, whereupon the assembly is dipped into a suitable soldering bath for a brief interval of time sufficient to form the solder connections at the terminal points. Due to the channel shape of the various grooves and indentations in the base member, relatively large solder holding areas are provided, thus effecting a greater conductive capacity between the soldered connections within relatively small surface areas on the base. As a matter of fact, the channels defined by the foil 29, as shown in Fig. 4 of the drawings, may be completely filled with solder which may even extend above the top of the channels to give very high current carrying capacity. Moreover, it will be observed that the base member 20 is initially formed with all of the required holes and indentations with the result that the aforementioned difficulties with respect to misalignment of the openings in the base and corresponding openings in the conducting portions of the printed circuit are completely obviated. Since the process of the present invention does not require the use of an etching step or the like, the insulating portions of the base member 20 are not contaminated by a residue of acid material or by a deposit of other undesirable elements. Thus, it will be observed that the conducting portions of the printed circuit formed by the method of the present invention may be disposed relatively close together without incurring the possibility of arcing therebetween. Furthermore, since the bonding operation or the reactivation of the adhesive layer comprises the final step in the process of the present invention except for the formation of the soldered connections, a bond possessing extremely good adhering qualities is provided which is not disturbed by subsequent treatment of the circuit to remove undesired foil areas or the like.

In what is believed, at present, to comprise a preferred embodiment of the present invention, the arrangement described above is modified in several particulars, the most important of which involves shaping the molded groove in the insulating base in such a fashion as to provide a point or line of purchase within the groove to aid the shearing operation and to cause the metal during the shearing operation to be stretched so that the metal remaining in the groove is wider than the groove with the result that, following shearing, the inherent resilience thereof will cause it to spring back into engagement with the walls of the groove to hold the severed metal segments within the grooves. With this arrangement, it may not be necessary to employ a reactivatable adhesive, and, in some applications, suitable fastening means such as rivets or the connectors of electrical components are sufficient to hold the conducting elements in the grooves. Another improvement embodied in the arrangement disclosed in Figs. 5 to 10, inclusive, of the drawings comprises the coating of one or both of the sides of the metal foil with solder whereby the sheet metal or foil is protected against oxidation, and the time involved in the soldering operation is greatly reduced. Still another improved feature involves applying the adhesive, in those cases where it is desirable or necessary, not only to the metal foil but also to the base member or only to the base member.

Referring now to Figs. 5 to 10 of the drawings, a rigid insulating panel 40 is formed in the same manner and of the same materials as the base 20, preferably by a molding operation, to provide both a plurality of openings 42 extending through the base 40 and a plurality of enlarged portions or recesses 44 surrounding the openings 42. The openings 42 are adapted to receive conductive members on external components such as lead wires on resistors, condensers and inductors or other terminal or connecting means such as those provided on transformers and electronic devices like transistors and high vacuum tubes. The enlarged portions 44 are adapted to receive a mass of conductive material to provide terminal connections to the conducting means extending through the openings 42. To provide a circuit pattern connecting the elements extending through the openings 42 and to provide other miscellaneous electrical connections, the base plate or panel 40 is provided with a plurality of grooves 46, the grooves 46 connecting at least some of the openings 42 and being adapted to receive conductive material providing a conductive pattern in accordance with the use to which the printed circuit is to be applied. The panel 40 may also be provided with one or more enlarged recesses 47 adapted to receive a large area of conductive material, thereby to provide electromagnetic shielding or other function requiring large area applications of conductive material to the insulating panel. Although Figs. 5 to 10, inclusive, illustrate the formation of a circuit pattern in only one surface of the base or panel 40, circuit patterns can be formed in both surfaces of the base plate 40 which are either electrically connected to provide a unitary printed circuit pattern including the conductive material on both surfaces or electrically independent to provide essentially separate circuit patterns.

The base plate 40, as indicated above, is provided with the openings 42, the enlarged portions 44, and the grooves 46 by any conventional material forming operation, but the panel 40 preferably is provided by a single molding or hot pressing operation utilizing either a laminated resin or other plastic construction or a molded "Bakelite" composition. Since the laminated base plate currently in use includes lamina of a paper product impregnated with a suitable plastic or resin and since the "Bakelite" composition normally used in providing panels for printed circuits includes approximately forty percent wood filler, the use of a molding operation in which the openings 42, the enlarged portions or recesses 44 and 47, and the channels or grooves 46 are simultaneously formed achieves a result which is not capable of attainment in the printed circuits of the prior art for the reason that, during the molding operation, the outer surfaces of the base plate 40 essentially consists of the liquid portion or phase of the material being molded. The wood filler, in the case of the molded "Bakelite" composition, and the paper lamina, in the case of the plastic laminated construction, are enclosed within the largely liquid outer portion of the molding composition so that, upon curing, a substantially sealed outer surface is provided for the panel 40, thereby sealing the hydroscopic material provided by the wood filler and paper lamina from contact with the air and thus preventing these materials from absorbing water and providing undesired low resistance paths in the base plate 40. These advantages are not obtained in the prior art wherein the material forming the base plate or panel 40 must be perforated by suitable means following the formation of the insulating panel and during the formation of the printed circuit to provide openings, such as the openings 42. These perforations place the hydroscopic material included in the interior of the base member in contact with the air and thus permit the absorption of moisture and the formation of low resistance conductive paths in the insulating base.

In order to provide guide means for facilitating the insertion of conductive members such as tube socket terminals or leads for circuit components into the openings 42 in the base panel 40, the panel 40 is provided, preferably by molding, with tapered or conical guide means 48 (Fig. 6) in communication with the openings 42, the tapered guide means 48 being formed in that surface of the panel 40 toward which the conductive members are advanced during an automatic assembling operation. Printed circuits are of particular value in electronic or electrical devices in which the assembling is carried on automatically, and, in a large proportion of the machines adapted to automatically assemble electronic circuits, the feeding members of various types supply electrical components at predetermined positions relative to a base plate. If, as indicated above, the base plate becomes laterally distorted during the heating and boring operations utilized in the printed circuit techniques of the prior art, the openings in the prior art devices similar to the openings 42 very often are not aligned with the feeding means at the assembling stations and, accordingly, the leads cannot be properly inserted into the base plate. However, by the provision of the tapered guide means 48 in communication with the openings 42 in the printed circuits of the present invention, even though the openings 42 are formed simultaneously with molding the base plate 42 to insure the proper location thereof, the guide means 48 permit a certain latitude of displacement between the feeding means in the component inserting mechanism and the openings 42 in the base plate while insuring the desired insertion of the component leads or other terminal means into the openings 42.

To provide means for improving the shearing action of the grooves 46 and the enlarged portions 44 and 47 and to provide means for insuring the retention of the severed portions of the sheet metal therein when the severed sheet is removed from the base plate 40, each of the grooves 46 is provided with an elongated rounded portion or hump 50 extending between substantially vertical shearing walls **46*a* of the channels 46. The upper end of the hump is slightly below or flush with the adjacent surface of the panel 40. In a similar manner, the enlarged portions 44 in the base plate 40 are provided with semispherical rounded portions or humps 52 centrally disposed relative to vertical shearing walls 44*a* of the recesses 44 with the openings 42 passing through centrally disposed portions of the humps 52. As an example, one panel or base plate 40 which has been found to be useful in forming printed circuits from sheet copper of a thickness of .0015 inch uses grooves or channels 46 having a width of .0625 inch, a depth of .018 inch adjacent the walls 46*a*, and a rounded portion or hump 50 whose uppermost extremity is located .005 inch below the surface of the base plate 40. Although these specific dimensions describe one embodiment of a channel or groove which is useful in performing the method of the present invention, it will be readily understood that these dimensions and the specific configuration of the grooves 46** vary in accordance with the gauges of metal used and other design consideration such as the desired current carrying capacity of the conductive pattern, the voltages with which the pattern is to be used, the pressure applied during the severing and forming operation, and many other factors.

In fabricating a printed circuit utilizing a base member or panel 40 of the present invention, a thin metal sheet 54 of substantially the same size as the general outline of the circuit pattern formed in the base 40 is positioned above the base member 40 covering at least the grooved and apertured portion of the panel 40. The surface of the metal sheet 54 disposed adjacent the panel 40 or the surface of the panel 40 disposed adjacent the metal sheet 54 or both of these surfaces may be provided with a normally dry, reactivatable adhesive material 55, if this media is to be utilized in producing a rigid bond between the severed portons of the metal sheet 54 and the base 40. The assembled panel 40 and metal sheet 54 are then disposed in a suitably operated press mechanism with a layer or mass of flexible, resilient or yieldable plastic material 56 disposed adjacent the surface of the metal sheet 54 which is spaced from the base member 40 (Fig. 7), the yieldably plastic or resilient material 56 being shown as connected to a press head 58 carried by an operating member 60.

To initiate the formation of the printed circuit during which portions or segments of the sheet metal 54 are severed from the sheet and simultaneously disposed within the channels 46 and enlarged portions 44 and 47, the press head 58 is moved downwardly relative to the base member 40 which is held in a fixed position so that the yieldable plastic material 56 clamps the sheet metal 54 against all but the recessed portions of the adjacent surface of the base member 40. In doing so the layer of material 56 establishes two spaced points or lines of shearing purchase, indicated as 60*a* and 60*b* (Fig. 8), adjacent the opposite walls 46*a* of each of the grooves 46. Continuing downward movement of the press head 58 and the yieldable plastic material 56 elongates the portion of the sheet metal 54 which is disposed between the points or lines 60*a* and 60*b* and above or within the grooves 46 until such time as additional or third points or lines of purchase, indicated at 62 (Fig. 8) are established between the lower surface of the elongated portions of the sheet metal 54 and the uppermost points on the rounded portions 50. During this elongation, the width of the sheet metal clamped between the lines or points of shearing purchase becomes greater than that of the channels 46. With respect to the enlarged areas 44, movement of the yieldable plastic material 56 toward the panel 40 establishes lines of shearing purchase adjacent the walls 44*a* of the enlarged portion 44, elongates the sheet metal disposed above the portions 44 and bounded by the associated lines of shearing purchase, and establishes additional lines or areas of purchase between the lower surface of the elongated portion of the sheet metal and the uppermost areas of the rounded portions 52. Since the apertures 42 open into the portions 44 substantially in the center of the rounded portions 52, the additional lines or areas of purchase established thereon also provide shearing purchase for severing the sheet metal 54 disposed above the apertures 42.

Figures 5, 6, 7, 8, 9, 10, 13, 14, 15:
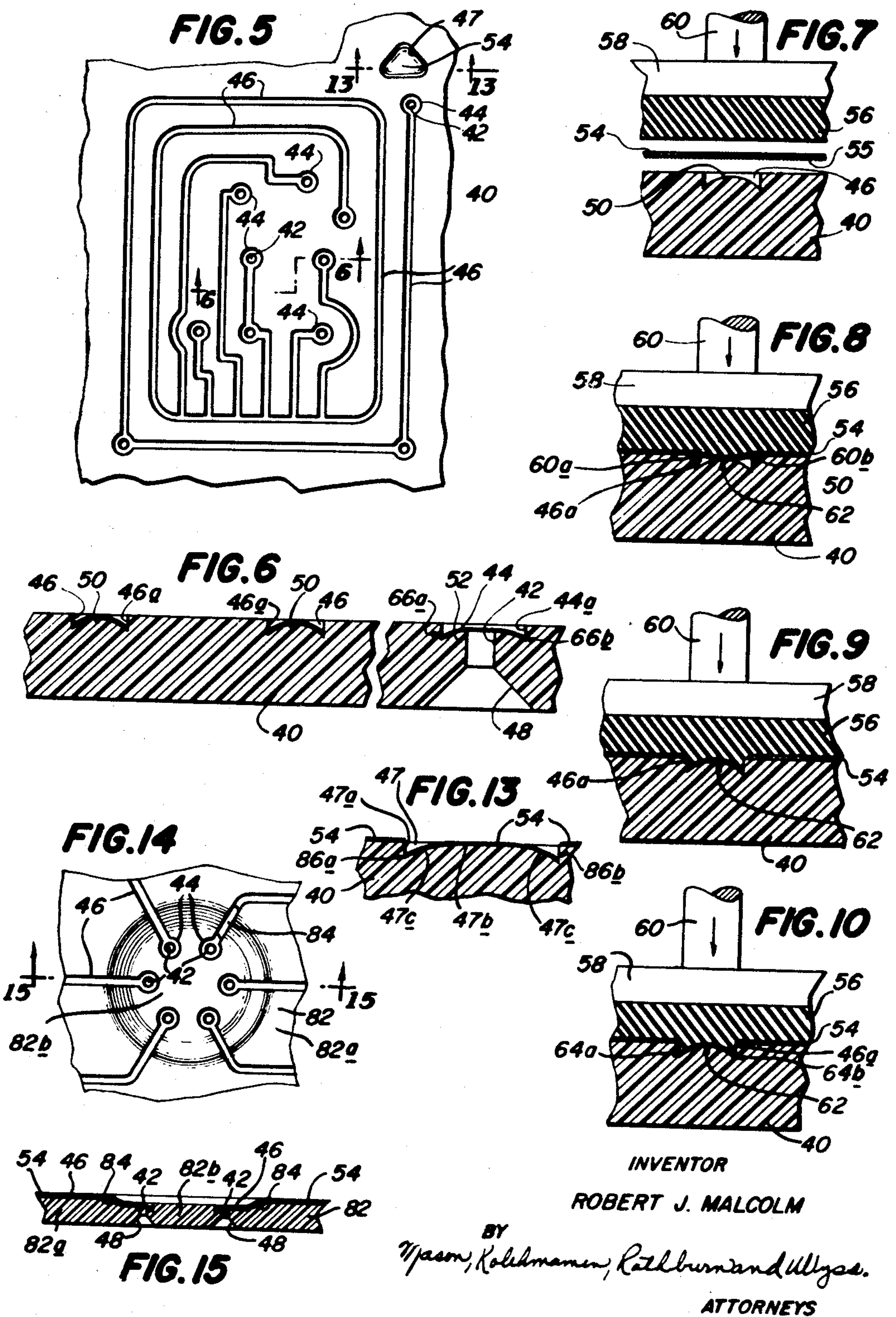
Fig. 5 is a fragmentary top plan view similar to Fig. 1 showing a modification of the present invention embodying features which, at present, are believed to constitute the preferred embodiment of the present invention.
Fig. 6 is an enlarged cross sectional view taken on line 6—6 of Fig. 5.
Fig. 7 is a greatly enlarged fragmentary view somewhat similar to Fig. 2 of the drawings illustrating one step in the manufacture of printed circuits of the type shown in Fig. 5 in accordance with the present invention.
Fig. 8 is a view similar to Fig. 7 illustrating a succeeding step in the manufacturing process of the present invention.
Fig. 9 is a view similar to Figs. 7 and 8 illustrating still another succeeding step in the process of manufacturing the printed circuit of Fig. 5.
Fig. 10 is another view similar to Fig. 7 illustrating still another step in the process of the present invention.
Fig. 13 is an enlarged fragmentary cross sectional view taken along line 13—13 in Fig. 5 illustrating an enlarged area of metal deposited on the insulating base.
Fig. 14 is a fragmentary top plan view somewhat analogous to a portion of Fig. 5 of the drawings illustrating a printed circuit formed on two different levels.
Fig. 15 is a sectional view taken on line 15—15 of Fig. 14.

To sever these portions of the sheet metal 54 which are disposed above the apertures, the enlarged portions 44 and the grooves 46, continuing downward movement of the press head 58 forces the yieldable plastic material 56 into the recessed portions of the grooves 46 and the enlarged portions 44 so that, as shown in Fig. 9, the sheet material 54 is sheared along the vertical shearing edges or walls 46*a* and 44*a*. The press head 58 continues to move downwardly until such time as the severed portions or segments of the sheet metal 54 engage the upper curved surfaces of the rounded portions 50 and 52. A further movement downwardly of the press head 58 forces the yieldable plastic material 56 into the apertures 42 to cooperate with annular side walls 42*a* thereof to sever the portions of the sheet metal 54 disposed over the openings 42, as represented in Fig. 3 in conjunction with the openings 25 and 26 in the base plate 20.

To retain the severed metal segments on the base plate 40, the head 58 and the yieldable plastic material 56 carried thereon are moved away from the base plate 40 to remove the pressure from the rounded and elongated segments severed from the sheet metal 54. These segments flex outwardly about the fulcrums provided by the rounded portions 50 and 52 toward their original uniplanar configuration due to their inherent resiliency so that the ends or edges thereof bite into the vertical side walls 44*a* and 46*a*, as indicated at 64*a* and 64*b* (Fig. 10) and 66*a* and 66*b* (Fig. 6), thereby to positively secure these severed portions against removal when the sheet 54 is removed from the surface of the base plate or panel 40. The elongation of the several portions of the sheet metal 54 together with the inherent resiliency of this metal, particularly when considered in conjunction with the rounded configuration of the lower walls of the grooves 46 and the enlarged recesses 44, mutually contribute to provide a mechanical interlock between the ends or edge portions of the severed metal and the vertical walls 44*a* and 46*a*, thereby to positively secure the severed portions in the recessed portions of the base plate 40.

Following the removal of the scrap portion of the sheet metal 54 from the base 40 by any suitable means, such as an air blast, and, if the sheet metal 54 of the base 40 has been provided with the reactivatable adhesive, the adhesive is then reactivated to provide a positive bond between the severed portions of the metal disposed within the enlarged portions 44 and the channels 46 by the application of a suitable solvent or heat, as described above in conjunction with the printed circuit provided on the base plate or panel 20. However, if the cutout portions of the sheet metal 54 disposed within the grooves 46 and the enlarged portions 44 are to be mechanically secured to the base plate 40, suitable fastening means, such as rivets, are applied to the base plate 40 in holding engagement with spaced portions of the conductive pattern provided in the recessed portion of the panel 40. Although the above method of severing and locating portions of the sheet metal 54 in the grooves 46 and the enlarged portions 44 has been described in conjunction with a press apparatus utilizing a layer of plastic material 56 carried on a movable press head 58, it is obvious that the fabricating method of the present invention could easily be accomplished by moving the base member 40 and the yieldable plastic material 56 toward each other or by maintaining the flexible material 56 in a fixed position and moving the base member 40 toward the yieldable plastic material 56 with the sheet metal 54 interposed therebetween.

In accordance with a further feature of the present invention, the sheet metal, which may or may not be provided with a coating of normally dry, reactivatable adhesive, is coated on at least one side with a layer of solder. In the fabrication of printed circuits, it is normally necessary to coat the outer surface of the conductive material, considered relative to the insulating panel, with a material such as solder both for the purpose of facilitating the formation of solder connections between the printed circuit and external components and for preventing oxidation of the relatively thin deposits of conductive material provided in the circuit pattern. Excessive oxidation of the conductive material increases the resistance of the connection and, in fact, may completely destroy the electrical continuity of a portion of the conductive pattern. In prior methods of forming printed circuits, following the deposition of the conductive pattern on one or more surfaces of an insulating panel and either prior or subsequent to the assembly of additional circuit components thereon, the pattern bearing surface of the dielectric panel is disposed in a molten bath of solder at a temperature of approximately 475 degrees Fahrenheit for a period of approximately four and one-half seconds. During this interval, the outer surfaces of the conductive pattern become coated with solder, and, if components have been assembled on the base plate, electrical connections between the component leads and the deposited conductive pattern are established. However, during this immersion in the high temperature bath of molten solder, the surface of the insulating panel often becomes blistered, thus breaking the seal between atmosphere and the hydroscopic materials contained in most dielectric base plates so as to increase the possibility that undesirable low resistance paths are provided in the printed circuit.

Figure 11:
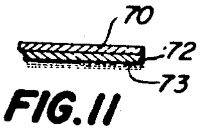
Fig. 11 is an enlarged fragmentary cross sectional view of a section of sheet metal which is useful in forming the printed circuits of the present invention and which is coated on one side with a layer of solder.

These disadvantages are positively avoided in the method of the present invention by coating a lamina 70 of solder (Fig. 11) on one surface of a sheet of metal 72 prior to the formation of the printed circuits. When the solder coated sheet metal 72 is utilized in forming printed circuits on a rigid dielectric panel, such as the base plate 40, the solder lamina 70 is disposed adjacent the yieldable plastic material 56 with the other surface of the sheet metal 72, which preferably is coated with a normally dry, reactivatable material 73 disposed adjacent the recessed surface of the base plate 40. The fabrication of the printed circuit utilizing the solder coated sheet metal 72 is otherwise identical to that described above in conjunction with the sheet metal 54 except that the prior coating of the sheet metal 72 with the solder 70 avoids immersing the completed printed circuit in a solder bath for longer than the approximately one and one-half seconds used to provide solder connections between the conductive pattern and the added components. However, this short immersion in the molten solder bath in the present invention is not long enough to cause blistering of the surfaces of the panel 40, and, accordingly, the difficulties resulting from blistering the outer surfaces of the panel 40 are avoided.

In some applications, it may be desirable to avoid any possibility of destructive oxidation or corrosion of the thin lamina of conducting material disposed on the base panel 40 by positively sealing both surfaces of the sheet metal from contact with air or moisture. The use of the sheet metal 72 coated on one side by the solder 70 prevents direct contact between the atmosphere and the exposed surface of the sheet metal 72. However, a sheet of metal 76 may be provided with coatings of solder 78 and 80 on both sides thereof, thereby to completely enclose the conductive base metal 76 in a material which prevents access of the atmosphere to the metal. When the sheet metal 76 is utilized in the method of forming printed circuits described above in conjunction with Figs. 5–10, the sheet of metal 76 is disposed between the yieldable plastic material 56 and the rigid base member 40 and a lamina 81 of normally dry, reactivatable adhesive is provided between the recessed surface of the base panel 40 and the adjacent one of the layers 78 or 80. The formation of the printed circuit remains the same as that described above.

Certain circuit design considerations often make it desirable to provide fairly large areas of conductive material on one or more surfaces of the base plate 40 for such uses as shielding components of the circuit from electromagnetic wave interference. To provide these relatively large areas of conductive material on the base plate 40 which may or may not be electrically connected to hte conductive pattern provided by the grooves or channels 46, recesses such as the recess 47 are formed in one or more of the surfaces of the panel 40, these recesses being defined by a continuous or discontinuous vertical shearing wall 47*a*. To provide a means for supporting and clamping the large area of sheet metal 54 which is to be disposed in the recessed area 47, the base 40 is provided with an upstanding portion or island 47*b*. This island comprises a substantially flat upper surface of the same general configuration as the recess 47 which is either flush with or positioned above or below the surface of the base member 40 and is joined with the vertical wall 47 by gently curved surfaces 47*c*. When the sheet metal 54 is disposed between the recessed surface of the base member 40 and the yieldable plastic material 56 and when relative movement is produced between the yieldable plastic material 56 and the base member 40, the yieldable plastic material 56 clamps the sheet metal 54 against the adjacent surface of the base panel 40 including the upper surface of the island 47*b* formed integral with the base 40. Continuing relative movement between the yieldable palstic material 56 and the rigid base member 40 elongates that portion of the sheet metal 54 which is disposed above the curved surfaces 47*c* of the island 47*b* and severs the sheet metal 54 adjacent the vertical walls 47*a*. When the yieldable plastic material 56 is removed, the elongated and deformed severed portions of the sheet metal 54, due to its deformation and inherent resiliency, spring back into interlocking engagement with the walls 47*a* of the recess 47 at the points indicated at 86*a* and 86*b*. In this manner, relatively large masses of metal 54 are severed from a sheet thereof and secured within the recesses 47 in the base plate 40. The severed portions of the sheet metal 54 are then secured in the recesses 47 either by the use of suitable mechanical fastening means or by reactivating an adhesive interposed between the outer surface of the island 47*b* and the inner surface of the severed sheet metal 54.

Design considerations often may require the provision of a base panel or plate 40 of a particular thickness in order to provide satisfactory mechanical strength for supporting the required number of circuit components, which thickness may be in excess of the thicknes normally utilized in the base plates of printed circuits currently being fabricated. Since component suppliers normally provide components having connecting leads of predetermined lengths which are long enough to extend through conventional printed circuit base members and provide an adequate extension for establishing connections with the conductive patterns disposed on one or more surfaces of the base plate, an increase in the thicknes of the base plate renders these lead lengths inadequate. Accordingly, an additional feature of the present invention is to provide a base plate 40 of varying thickness which permits certain portions thereof to be of adequate thickness to provide mechanical strength or other functions and other portions to be of a lesser thickness through which the terminal leads of existing components can extend. This multilevel base must also be capable of being utilized in the method of forming printed circuits of the present invention wherein a sheet of metal is disposed between a mass of yieldable plastic material and a rigid base member without producing severing of the sheet metal in those areas where the greater and lesser thickness portions of the base are joined together.

More specifically, Figs. 14 and 15 of the drawings disclose a fragmentary portion of a base member 82 which may be very similar to the base member 40 described above. Moreover, this base member 82 generally will have throughout the major area thereof designated as 82*a* a uniform thickness which may be similar to the thickness of the base member of Fig. 5. However to accommodate certain electrical components, the base member 82 may be provided with areas of reduced thickness one of which is illustrated in Figs. 14 and 15 of the drawings designated as 82*b*. Except for the fact that the base member 82 has areas of different thickness, the grooves, openings, and recesses surrounding the openings may be identical, at least from a functional standpoint, to those disclosed in Fig. 5 of the drawings. Consequently, in Figs. 14 and 15, the grooves are all designated by the reference numeral 46 whether they are in the portion 82*a* or in the portion 82*b*. Similarly, the openings are designated by the reference numeral 42, and the recesses surrounding the openings are designated by the reference numeral 44. As in the preceding embodiment, the grooves 46 are preferably each provided with the hump 50, and the recesses 44 are provided with the humps 52.

For the purpose of joining the grooves 46 where they extend into two different levels of the base member 82 in a manner so that no shearing will occur at these points, the base plate is provided with a rounded curve 84 at each area where the grooves 46 extend from one level to another. As illustrated in the drawings, this rounded curved portion is provided at all areas where the base member 82 changes from one level to another, but obviously it would only be necessary in the grooves or recesses where it is desired to place the sheet metal material. By employing the gently curving surface of the area 84, it will be apparent that, by virtue of the pressure applied by the yieldable plastic 56 during the operation represented by Figs. 7 to 10, inclusive, of the drawings, the metal material designated in Fig. 15 by the reference numeral 54 is forced into the grooves and conforms to the curved portions 84 interconnecting the two levels without producing any shearing action at the curved portions. Thus, the process can be employed in the same way described above where the base member 82 has two different levels. It will be appreciated that the same situation will hold if more than two levels are employed, although this will not generally be required.

Although the present invention has been described in conjunction with using a reactivatable adhesive material, preferably a solvent reactivated or a heat reactivated one, it should be appreciated that a pressure reactivated adhesive might also be employed. For example, in the arrangement disclosed in Figs. 5 to 10, inclusive, a pressure reactivated adhesive might be applied to one surface of the sheet metal 54 and also to the portions of the base member 40 which it is desired to cover with the sheet metal, specifically the grooves 46 and recesses 44. These adhesive coatings would preferably be normally dry. Then during the manufacturing process and specifically when shearing the sheet metal member and forcing it into the grooves, the pressure reactivated adhesive would simultaneously be activated with the result that the product would be completed immediately following the shearing step.

Although the present invention has been described in conjunction with insulating panels having conductive patterns disposed thereon of a type normally encountered in electronic circuits such as those employed in wave signal receivers and the like, it should be understood that the term "printed circuit" as used in this application encompasses circuits useful in many different types of apparatus and for varying applications. For example, it has been found that the present invention is admirably suited to provide electrical circuits in connection with various appliances such as electric ranges and the like wherein the current carried by the "printed circuit" would be measured in amperes rather than milliamperes. It will readily be apparent, however, that the present invention will be equally applicable, and it is merely a question of the cross sectional area of the conductive portion of the "printed circuit." For such high current applications, the adhesive may not be required since the metal will have sufficient thickness so that it will remain in place merely by the use of a few fastening means such as rivets or the like.

While the present invention has been shown and described in conjunction with a number of embodiments thereof, it will be apparent to those skilled in the art that various other modifications may be made therein without departing from the principles of the present invention, and it is intended therefore in the appended claim to cover all such changes and modifications as fall within the true spirit and scope of the principles of the present invention.

What is claimed and desired to be secured by Letters Patent of the United States is:

A printed circuit device comprising a molded base of rigid insulating material of a given thickness and including at least one generally uniplanar area of a thickness less than said given thickness, said base including a gradually curving portion interconnecting the portion of said base that is of said given thickness with said area of lesser thickness, at least one recessed portion formed in said area, said recessed portion being defined by generally vertically extending side walls, a plurality of channels formed in said base and including at least one such channels that extends from a portion of said base that is of said given thickness through said curving portion to connect with said recessed portion in said area of lesser thickness, said channels being defined by generally vertical extending side walls, and an electrically conductive material disposed in said channels and said recessed portion.

References Cited in the file of this patent

UNITED STATES PATENTS

| | | |
|---|---|---|
| 2,451,725 | Franklin | Oct. 19, 1948 |
| 2,716,268 | Steigerwalt | Aug. 30, 1955 |
| 2,757,443 | Steigerwalt et al. | Aug. 7, 1956 |

FOREIGN PATENTS

| | | |
|---|---|---|
| 596,830 | Germany | May 11, 1934 |